(12) United States Patent
Choi

(10) Patent No.: US 6,413,787 B1
(45) Date of Patent: Jul. 2, 2002

(54) METHOD FOR FABRICATING DIELECTRIC FILM

(75) Inventor: Hong-Goo Choi, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/613,256

(22) Filed: Jul. 10, 2000

(30) Foreign Application Priority Data

Jan. 25, 2000 (KR) .......................................... 2000/3420

(51) Int. Cl.[7] .............................................. H01L 21/00
(52) U.S. Cl. ........................... 438/3; 438/240; 438/785
(58) Field of Search ................................. 438/396, 786, 438/724, 255, 3, 253, 397, 398, 240, 785

(56) References Cited

U.S. PATENT DOCUMENTS

| | | | |
|---|---|---|---|
| 5,859,760 A | * | 1/1999 | Park et al. ................... 361/313 |
| 6,077,737 A | * | 6/2000 | Yang et al. ................... 438/240 |
| 6,204,117 B1 | * | 3/2001 | Chiou et al. ................. 438/253 |
| 6,228,709 B1 | * | 5/2001 | Hsieh .......................... 438/255 |
| 6,251,720 B1 | * | 6/2001 | Thakur et al. ............... 438/240 |

OTHER PUBLICATIONS

S. C. Sun et al., "A Novel Approach for Leakage Current Reduction of LPCVD $Ta_2O_5$ and $TiO_2$ Films by Rapid Thermal $N_2O$ Annealing", *IEDM 94*, 1994, pp. 333–336.

Rama I. Hedge et al., "Growth and surface chemistry of oxynitride gate dielectric using nitric oxide", *Appl. Phys. Letters*, vol. 66, No. 21, May 22, 1995, pp. 2882–2884.

Qiang Lu et al., "Leakage Current Comparison Between Ultra–Thin $Ta_2O_5$ Films and Conventional Gate Dielectrics", *IEEE Electron Device Letters*, vol. 19, No. 9, Sep. 1998, pp. 341–342.

* cited by examiner

*Primary Examiner*—Tuan H. Nguyen
(74) *Attorney, Agent, or Firm*—Morgan, Lewis & Bockius LLP

(57) ABSTRACT

A method for fabricating a dielectric film can increase capacitance by etching a film generated by annealing for preprocess using NO gas. The method for fabricating the dielectric film includes: a step for performing a first annealing on a silicon lower electrode, and forming a first insulating film on the upper surface of the silicon lower electrode; a step for etching the first insulating film; a step for forming a second insulating film on the silicon lower electrode; and a step for performing a second annealing.

16 Claims, 2 Drawing Sheets

METHOD FOR FABRICATING DIELECTRIC FILM

BACKGROUND OF THE INVENTION

1. Field of the Invention

The present invention relates to a method for fabricating a dielectric film for a semiconductor device, and in particular to an improved method for fabricating a dielectric film which can increase capacitance by etching a film generated by annealing for preprocess using NO gas.

2. Description of the Background Art

In a conventional semiconductor device, $SiO_2$ has been used as a material of a dielectric film composing a capacitor. The $SiO_2$ dielectric film is easy to fabricate and has superior interface characteristics with silicon. However, as an integration degree of the device is increased, a projected area of the capacitor in each cell is decreased. As a result, a soft error is generated and a refresh time is reduced.

Accordingly, various methods have been studied in order to sufficiently maintain capacitance of the capacitor of each cell even if an area of the memory cell is decreased. The research direction is divided into a structure research and material research. The structure research attempts to form a thin dielectric film and increase an effective surface area. The material research tries to replace the $SiO_2$ dielectric film with $(Ta_2O_5)$ and $BST(Ba,Sr)TiO_3)$ dielectric films having a high dielectric constant.

FIGS. 1(a) to 1(c) illustrate the sequential steps of the conventional method for fabricating the $Ta_2O$ dielectric film.

As shown in FIG. 1(a), a first insulating film 3 consisting of nitride is formed on a silicon lower electrode 1 by a first annealing that is an annealing for preprocess. The first annealing is performed at the $NH_3$ atmosphere by employing a rapid thermal process (RTP) device. A thickness of the first insulating film 3 formed after the first annealing is approximately 10 Å. Here, the nitrogen in the first insulating film 3 is regularly spread on the entire surface of the first insulating film 3.

The first insulating film 3 prevents the silicon lower electrode 1 from being oxidized in a succeeding step. In addition, an Si—N bond that is a bond between the silicon composing the lower electrode 1 and the nitrogen composing the first insulating film 3 is formed at an interface of the silicon lower electrode 1 and the first insulating film 3 because of the first insulating film 3. When the Si—N bond is formed at the interface of the silicon lower electrode 1 and the first insulating film 3, the interface characteristics between the silicon lower electrode 1 and the first insulating film 3 are deteriorated, thereby increasing leakage current.

As depicted in FIG. 1(b), a second insulating film 5 consisting of $Ta_2O_5$ is formed on the first insulating film 3. Here, the first insulating film 3 prevents the surface of the silicon lower electrode 1 from being oxidized during a step for forming the second insulating film 5 consisting of $Ta_2O_5$.

As illustrated in FIG. 1(c), in order to improve the characteristics of the dielectric film, the structure as shown in FIG. 1(b) is annealed by a second annealing that is an annealing for postprocess. The second annealing is mostly carried out at the $N_2O$ atmosphere by using the RTP device.

The characteristics of the dielectric film are improved by the second annealing on the following grounds.

When the second annealing is performed at the $N_2O$ atmosphere, oxygen diffuses and penetrates into the first insulating film 3 from the atmosphere gas. If an oxide film is formed by the oxygen at the lower portion of the first insulating film 3, the Si—O bond is increased and the Si—N bond is decreased. Since the Si—O bond has superior interface characteristics to the Si—N bond, as the Si—O bond is increased at the interface between the silicon lower electrode 1 and the first insulating film 3, the interface characteristics are improved and the leakage current is reduced. In case the second annealing time is long, the Si—O bond is more increased. Accordingly, the leakage current may be more decreased by increasing the second annealing time.

However, the conventional method for fabricating the dielectric film has the following disadvantages.

Firstly, the capacitance is reduced by the first insulating film formed by the first annealing. The capacitance C of the capacitor is represented by the following Expression.

$$C=\epsilon(A/t)$$

In the Expression, C, $\epsilon$, A and t indicate the capacitance, the dielectric constant, a width of the dielectric film and a thickness thereof, respectively. As shown in the above Expression, as the thickness of the dielectric film is increased, the capacitance is decreased. Accordingly, the capacitance is reduced as many as the thickness of the dielectric film is increased by the first insulating film.

Secondly, the characteristics of the interface are deteriorated and the leakage current is increased due to the Si—N bond existing at the interface between the silicon lower electrode 1 and the first insulating film 3.

Thirdly, when the Si—N bond existing at the interface between the silicon lower electrode 1 and the first insulating film 3 is replaced by the Si—O bond according to the second annealing, the leakage current may be decreased. However, since the dielectric constant of the oxide film is smaller than that of the nitride film, the capacitance is reduced.

SUMMARY OF THE INVENTION

Accordingly, it is a primary object of the present invention to increase capacitance by decreasing a thickness of an insulating film formed on a silicon lower electrode and a thickness of a dielectric film.

It is another object of the present invention to reduce leakage current of a capacitor by improving characteristics of an interface between a silicon lower electrode and an insulating film.

It is still another object of the present invention to increase capacitance by using a dielectric film having a high dielectric constant.

In order to achieve the above-described objects of the present invention, there is provided a method for fabricating a dielectric film, including: a step for performing a first annealing on a silicon lower electrode, and forming a first insulating film on the upper surface of the silicon lower electrode; a step for etching the first insulating film; and a step for forming a second insulating film on the silicon lower electrode.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a dielectric film in accordance with a preferred embodiment of the present invention will now be described in detail with reference to the accompanying drawings.

FIGS. 2(a) to 2(d) illustrate sequential steps of the method for fabricating the dielectric film in accordance with the present invention.

Figure 2A:
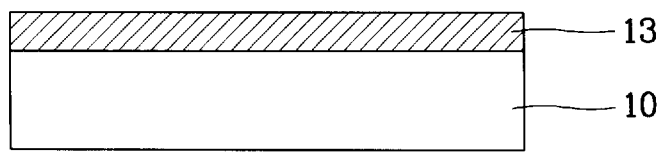
FIGS. 2(a) to 2(d) illustrate sequential steps of a method for fabricating a dielectric film in accordance with a preferred embodiment of the present invention.

As shown in FIG. 2(a), a first insulating film 13 is formed on a silicon lower electrode 10 by a first annealing that is an annealing for preprocess. When a silicon oxide film (not shown) is formed on the silicon lower electrode 10, a thickness thereof is set below 100 Å. The first insulating film 13 may be formed on the silicon oxide film. The first annealing is performed at the NO atmosphere by employing a furnace or a rapid thermal process (RTP) device. When the furnace is used, the first annealing is carried out at a temperature between 700 and 900° C. In the case that the RTP device is employed, the first annealing is performed at a temperature between 500 and 1000° C.

The first insulating film 13 serves to prevent the silicon lower electrode 10 from being oxidized during a succeeding step. Especially, in this embodiment, the first insulating film 13 is an oxynitride film. In the first insulating film 13 consisting of the oxynitride formed by the first annealing, nitrogen is positioned mostly at a lower portion of the interface between the first insulating film 13 and the silicon lower electrode 10. In addition, an Si—N bond and an Si—O bond exist at the interface between the first insulating film 13 and the silicon lower electrode 10 due to oxygen elements of the oxynitride composing the first insulating film 13. As a result, as compared with the conventional method, the characteristics of the interface between the first insulating film 13 and the silicon lower electrode 10 are improved.

Figure 2B:

As illustrated in FIG. 2(b), a thickness of the first insulating film 13 is decreased by etching. In the present embodiment, the first insulating film 13 is wet or dry etched by using a solution or gas including HF.

Here, when the first insulating film 13 is etched and completely removed, a thickness of the whole dielectric film is decreased, and thus the capacitance is improved. However, the interface of the superior characteristics that is positioned between the silicon lower electrode 10 and the first insulating film 13 is also removed, thereby deteriorating the characteristics of the interface between the silicon lower electrode 10 and the dielectric film during the succeeding step. On the other hand, in the case that the first insulating film 13 is not completely etched, the interface of the superior characteristics between the first insulating film 13 and the silicon lower electrode 10 can be maintained. However, the thickness of the whole dielectric film is increased, and thus the capacitance is reduced. Accordingly, the thickness of the first insulating film 13 that remains after etching must be controlled in consideration of the above items. In the present embodiment, the first insulating film 13 is etched to have a thickness between 0 and 10 Å.

Since the nitrogen in the first insulating film 13 is mostly positioned at the lower portion of the interface between the first insulating film 13 and the silicon lower electrode 10, even if the first insulating film 13 is completely removed by etching, a large amount of nitrogen is included at the lower portion of the surface of the silicon lower electrode 10, and thus prevents the silicon lower electrode 10 from being oxidized during the succeeding step.

Figure 1A:
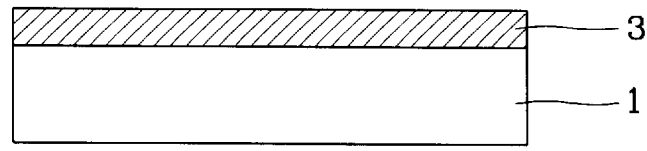
FIGS. 1(a) to 1(c) illustrate sequential steps of a conventional method for fabricating a dielectric film.
Figure 1B:
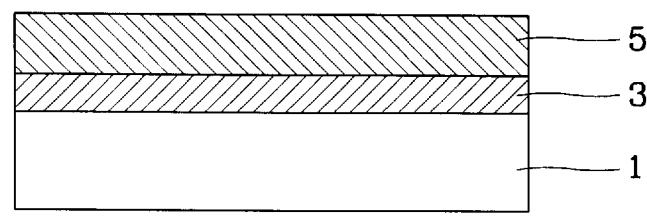
Figure 1C:
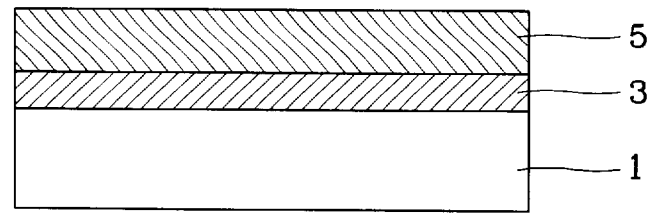

As depicted in FIG. 1(c), a second insulating film 15 is formed on the silicon lower electrode 10. The second insulating film 15 consists of $Ta_2O_5$, $Al_2O_3$, $TiO_2$, PZT and BST which have a higher dielectric constant than $SiO_2$. Especially, in the present invention, the second insulating film 15 consists of $Ta_2O_5$. Here, the $Ta_2O_5$ film is formed according to a chemical vapor deposition or physical vapor deposition using a gas or solution including Ta, or according to a sputtering using a substrate including Ta, and operated as a dielectric film individually or together with the first insulating film 13.

Figure 2C:
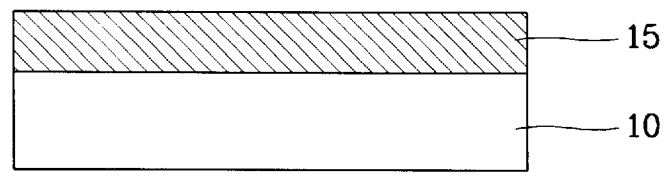
Figure 2D:
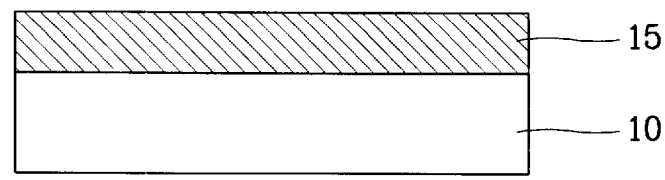

Thereafter, as illustrated in FIG. 2(d), a second annealing that is an annealing for postprocess is carried out on the structure as shown in FIG. 2(c), thereby improving the characteristics of the dielectric film. The second annealing is mostly performed at the $O_2$, $O_3$ or $N_2O$ atmosphere by employing the furnace or RTP device. A temperature of the second annealing is set between 400 and 850° C. at the $O_2$ atmosphere, between 300 and 700° C. at the $O_3$ atmosphere and between 600 and 850° C. at the $N_2O$ atmosphere.

The principle of improving the characteristics of the dielectric film by the second annealing will now be described.

When the second annealing is carried out in the aforementioned conditions, the oxygen diffuses and penetrates into the silicon lower electrode 10 from the atmosphere gas. The nitrogen positioned at the lower portion of the silicon lower electrode 10 is oxidized due to the oxygen, thereby forming the Si—O bond at the interface between the dielectric film and the silicon lower electrode 10. As a result, the characteristics of the interface between the silicon lower electrode 10 and the first insulating film 13 or second insulating film 15 are improved, and the leakage current of the capacitor is decreased.

As discussed earlier, the method for fabricating the dielectric film in accordance with the present invention completely etches the insulating film that is formed in order to prevent oxidation of the silicon lower electrode, or reduces a thickness of the insulating film, thereby decreasing the thickness of the whole dielectric film and increasing the capacitance.

In addition, the method for fabricating the dielectric film in accordance with the present invention forms the insulating film including oxygen elements in order to prevent oxidation of the silicon lower electrode, thereby improving the characteristics of the interface between the dielectric film and the silicon lower electrode, and reducing the leakage current.

Moreover, the method for fabricating the dielectric film in accordance with the present invention forms the dielectric film having a high dielectric constant without oxidizing the silicon lower electrode, which results in the increased capacitance.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a dielectric film, comprising:
   forming a silicon lower electrode;
   performing a first annealing on a silicon lower electrode;
   forming a silicon oxide film on the silicon lower electrode;

forming a first insulating film on the silicon oxide film;

etching the first insulating film;

forming a second insulating film on the silicon lower electrode; and performing a second annealing on the second insulating film.

2. The method according to claim 1, wherein the first annealing is performed by using NO gas.

3. The method according to claim 1, wherein the first annealing is performed by employing a furnace or a rapid thermal processing (RTP) device.

4. The method according to claim 1, wherein the first annealing is performed at a temperature between 650 and 900° C.

5. The method according to claim 1, wherein a silicon oxide film is formed on the surface of the silicon lower electrode.

6. The method according to claim 5, wherein a thickness of the oxide film is set below 100 Å.

7. The method according to claim 1, wherein the first insulating film is an oxynitride film.

8. The method according to claim 1, wherein the first insulating film is etched by using a solution or gas including HF.

9. The method according to claim 1, wherein a thickness of the first insulating film that remains after etching is 0 to 10 Å.

10. The method according to claim 1, wherein the second insulating film comprises a material having a higher dielectric constant than $SiO_2$.

11. The method according to claim 10, wherein the second insulating film comprises at least one of $Ta_2O_5$, $Al_2O_3$, $TiO_2$, PZT and BST.

12. The method according to claim 11, wherein $Ta_2O_5$ is formed by using a solution, gas or substrate including Ta.

13. The method according to claim 1, wherein the second annealing is performed by using at least one of $O_2$, $O_3$ and $N_2O$ gas.

14. The method according claim 13, wherein the second annealing using the $O_2$ gas is performed at a temperature between 400 and 850° C.

15. The method according claim 13, wherein the second annealing using the $O_3$ gas is performed at a temperature between 300 and 700° C.

16. The method according claim 13, wherein the second annealing using the $N_2O$ gas is performed at a temperature between 600 and 850° C.

* * * * *